(12) United States Patent
Liu et al.

(10) Patent No.: US 6,762,868 B2
(45) Date of Patent: Jul. 13, 2004

(54) ELECTRO-OPTICAL PACKAGE WITH DROP-IN APERTURE

(75) Inventors: Jwei Wien Liu, Plano, TX (US); Thomas A. Kocian, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/990,952

(22) Filed: Nov. 9, 2001

(65) Prior Publication Data

US 2002/0056900 A1 May 16, 2002

Related U.S. Application Data

(60) Provisional application No. 60/249,383, filed on Nov. 16, 2000.

(51) Int. Cl.[7] ............................................... G02B 26/00
(52) U.S. Cl. ..................................... 359/237; 359/290
(58) Field of Search ................................ 359/237, 290, 359/291, 298, 808, 819, 811, 214, 224; 372/32, 20

(56) References Cited

U.S. PATENT DOCUMENTS 5,939,785 A * 8/1999 Klonis et al. ............... 257/729
6,356,378 B1 * 3/2002 Huibers ...................... 359/291
6,369,933 B1 * 4/2002 O'Callaghan ............... 359/247

OTHER PUBLICATIONS

U.S. patent application Ser. No. 09/991,446, Liu, filed Nov. 9, 2001.
U.S. patent application Ser. No. 09/992,178, Lopes et al., filed Nov. 5, 2001.

* cited by examiner

Primary Examiner—Georgia Epps
Assistant Examiner—Richard Hanig
(74) Attorney, Agent, or Firm—Charles A. Brill; Wade James Brady, III; Frederick J. Telecky, Jr.

(57) ABSTRACT

A drop-in aperture 20, which improves the performance and lowers the cost of electro-optical SLM packages. The disclosed package provides a separate metal light shield (aperture) 20 and antireflective coated cover 33, and positions the aperture 20 inside the package 40 in close proximity to the SLM's 41 surface. This approach further uses an on-chip SLM light shield to define the projected screen border, thereby making the edge definition of the metal drop-in aperture less critical. Therefore, the cover can be mounted well away from the plane of the SLM, which relaxes the defect requirements of the cover and lowers the cost of the overall package. The package of this invention improves the performance and lifetime and lowers the cost of projection display systems.

29 Claims, 3 Drawing Sheets

ELECTRO-OPTICAL PACKAGE WITH DROP-IN APERTURE

CROSS-REFERENCE TO RELATED APPLICATIONS

This application claims priority under 35 USC §119(e)(1) of provisional application No. 60/249,383 filed Nov. 16, 2000.

This invention is related to concurrently filed U.S. patent application Ser. No. 09/992,178 filed Nov. 5, 2001 entitled "Package with Environmental Control Material Carrier," the contents of which are hereby incorporated by reference in this application, and U.S. patent application Ser. No. 09/991,446 filed Nov. 9, 2001 entitled "MEMS Enclosure."

BACKGROUND OF THE INVENTION

1. Field of the Invention

The present invention relates to the packaging of semiconductor chips and particularly to that of electro-optical devices, such as a spatial light modulator (SLM).

2. Description of the Related Art

Packaging is a critical part of producing a high-performance electro-optical semiconductor device, such as a micromirror array or other spatial light modulator (SLM) for use in projection display systems. For example, in a micromirror, light is reflected by the mirrors, which, if in an ON state, form the projected image on a screen. To prevent stray light from reflecting from interconnect bond-pads, bond-wires, and other peripheral structures on the device, it is necessary to provide a light shield around the outer portion of the device. Such a shield typically has been provided by depositing an opaque metal on to the surface of the package's cover glass and then opening an optically clear aperture in the center of the window to expose the mirrors to the light. This process has added cost to the package, introduced defects in the projected image from blemishes in the glass aperture, which is near the focal plane, and required a great deal of time and manufacturing capacity. As a result, the packaging of micromirror and other SLM chips for use in projection displays and other electro-optical applications has continued to present a cost barrier that contributes to higher priced projection display products.

FIG. 1 is a drawing of a typical micromirror package. In the past, this has often been a hermetic package, although lower-cost plastic packages are now becoming available, as referenced below. The package is comprised of a ceramic case 10 and an optical cover glass (lid) 11. The cover glass 11 has an aperture (clear opening) 110 and a light shield 120. The cover glass 11 is attached to the package case 10 by using hermetic welding or near-hermetic adhesive techniques. In the past, the purpose of the light shield 120 has been two-fold; (1) to prevent the interconnect bond pads and wires around the periphery of the micromirror from reflecting stray light and (2) to form a sharp border around the edge of the projected image. A getter material for absorbing moisture typically is attached to the bottom surface of the glass cover 11.

In these packages, the light shield 120 is applied to the glass cover 11 by vapor depositing a thin film metalization on one side (top or bottom) of the flat glass. The aperture 110 is then opened through the metalization by chemically etching the metalization in the center area of the cover glass 11, as shown. In a typical application, in addition to preventing stray light from getting into the projected image, the light shield 120 has been used to form a border around the edge of the projected image. In order to accomplish both of these functions, the shield must be in close proximity to the micromirror surface, such that the edge of the aperture is sharply focused. Since the aperture is deposited on the surface of the glass cover, the glass cover is also near the focal plane of the micromirror. As a result, even the smallest blemishes in the glass are in focus and therefore are visible in the projected image. This has required that high purity glass be used for the cover glass 11 and that these covers be handled with extreme care so as not to scratch the surface. Pure glass and special handling drive up the cost of the micromirror package.

There is a recognized need for a light shield that overcomes the limitations discussed above.

SUMMARY OF THE INVENTION

This invention discloses a drop-in aperture as an improvement for a high-performance, low-cost SLM package. The disclosed approach separates the metal aperture from the anti-reflective (AR) coated cover window and positions the aperture inside the package cavity in close proximity to the SLM's surface. This allows the AR coated glass cover to be located away from the SLM and out of the focal plane, which considerably relaxes the blemish requirements for cover glass since the blemishes are no longer focused in the projected image. The relaxed blemish requirements enable the use of plastic covers.

In addition, this approach further balances the photopic appearance between the edges of the metal drop-in aperture and the on-chip micromirror light shield, so that the on-chip light shield is now used to precisely define the projected screen border. The makes the edge definition of the metal apertures less critical and loosens the alignment requirements of the drop-in aperture, further reducing the overall package cost.

Potential advantages of the disclosed invention are:
1. improved screen border definition,
2. easier assembly process, and
3. lower cost package.

DETAILED DESCRIPTION

This invention discloses a drop-in aperture as an improvement for a high-performance, low-cost SLM package. In this invention, the aperture is separated from the glass or plastic cover and placed in close proximity to the SLM to cover the bond wire area in the package and prevent light from reaching surfaces in the bond wire area. In this approach, a built-in light shield on the SLM is used to define the projected image's border, thereby relaxing the requirements for the aperture edges since it is no longer used to define the border of the projected image. And very importantly, by separating the cover glass from the aperture, the glass cover can be mounted well out of the focal plane, thereby relaxing its defect requirements and making it a much lower cost piece-part. All of these factors are instrumental in providing a higher-performance, higher-quality, and lower-cost package.

Figure 1:
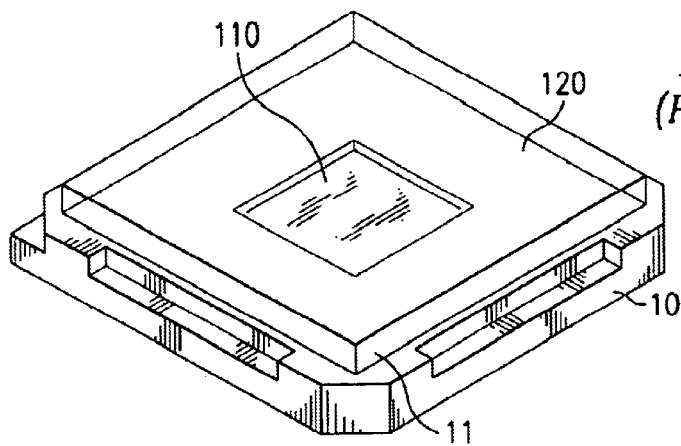
FIG. 1 is a drawing of a conventional prior art DMD package having a glass cover with deposited metal light shield and etched aperture.
Figure 2:
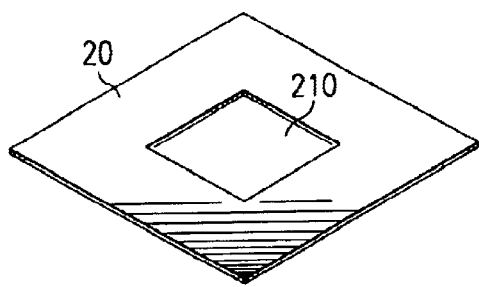
FIG. 2 is a drawing of the drop-in aperture of this invention.

FIG. 2 is a drawing of the drop-in aperture 20 (light shield) of this invention. This is a separate stamped metal piece-part having an aperture opening 210 punched out in the center area of the light shield. Standard metal punching and surface coating processes are used in the fabrication of these piece-parts, rather than the previous method of depositing metal on the glass window and chemically etching the aperture opening. This results in a low-cost, high-volume metal piece-part. Also, in this approach, the projected screen border is precisely defined by an on-chip light shield so that the edges of the aperture opening 210 are no longer used to define this projected screen border, thereby relaxing the requirements for the metal aperture edges. The metal light shield is now used only to prevent stray light reflections from the bond wires, bond pads, and other peripheral structures. As a result, precision alignment of the aperture to the SLM is no longer required.

Figure 3:
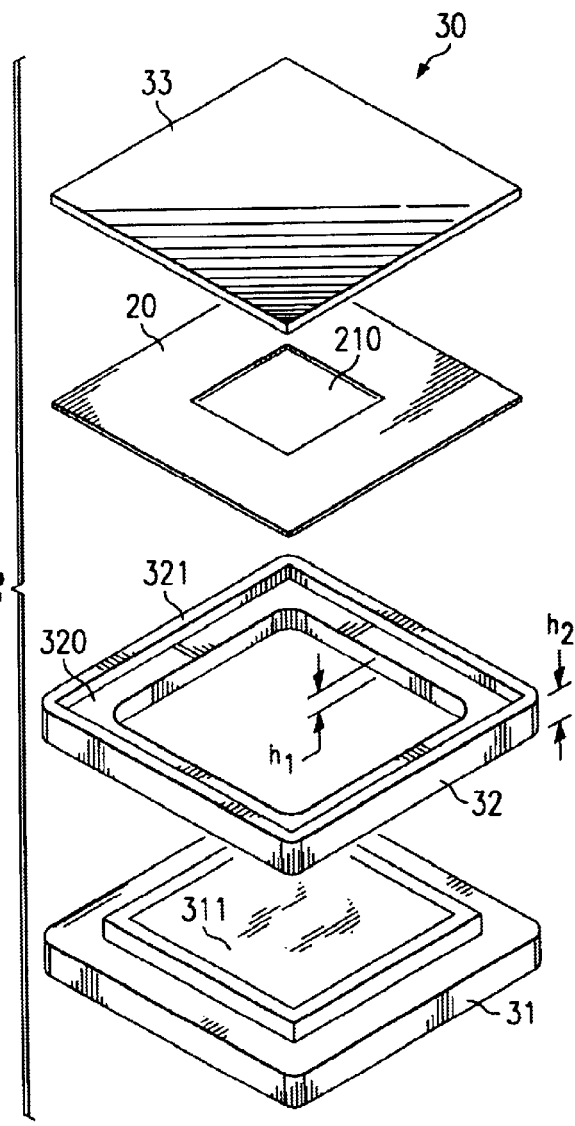
FIG. 3 is a drawing showing the build-up of a SLM package with the drop-in aperture of this invention.

FIG. 3 is a drawing showing an example of a DMD package 30 with the drop-in aperture feature of this invention. The package is comprised of a substrate 31, a case 32, the drop-in aperture 20 of this invention, and a clear glass cover (lid) 33. The DMD 311 is shown mounted on the upper surface of the substrate 31 where it is bonded out to the package's electrical interconnect bond pads. The package case 32 is manufactured into the substrate and has two flat mounting surfaces; (1) one surface 320 being down inside the case's cavity in close proximity to the surface of the DMD 311 and used for attaching the drop-in aperture 20 of this invention, and (2) the other, top surface 321 for attaching the cover glass 33. By making the elevation ($h_1$) of the aperture mounting-surface 320 small relative to the case's 32 wall height ($h_2$), the drop-in aperture can be located in close proximity to the DMD's surface, while the glass cover is well out of the micromirror's focal plane and as a result, blemishes and scratches in the aperture area of the cover glass are far less distinguishable in the projected image.

As mentioned above, the package is manufactured with the lower substrate 31 and case sidewall 32 molded together. In assembling the package, the micromirror 311 is mounted on the surface of the substrate 31 and then electrically connected to the bond pads. The aperture 20 is then placed on the case's 32 lower ledge 320 and secured using an adhesive, or other attachment method, at the corners of the aperture. Finally, the optically transparent top cover 33 is attached to case's 32 top mounting surface 321, also by applying an adhesive. This places the aperture in close proximity to the surface of the micromirror, yet leaves the glass cover further away from the micromirror and out of the micromirror's focal plane. These changes improve the optical performance of the micromirror device while lowering the packaging cost.

Figure 4:
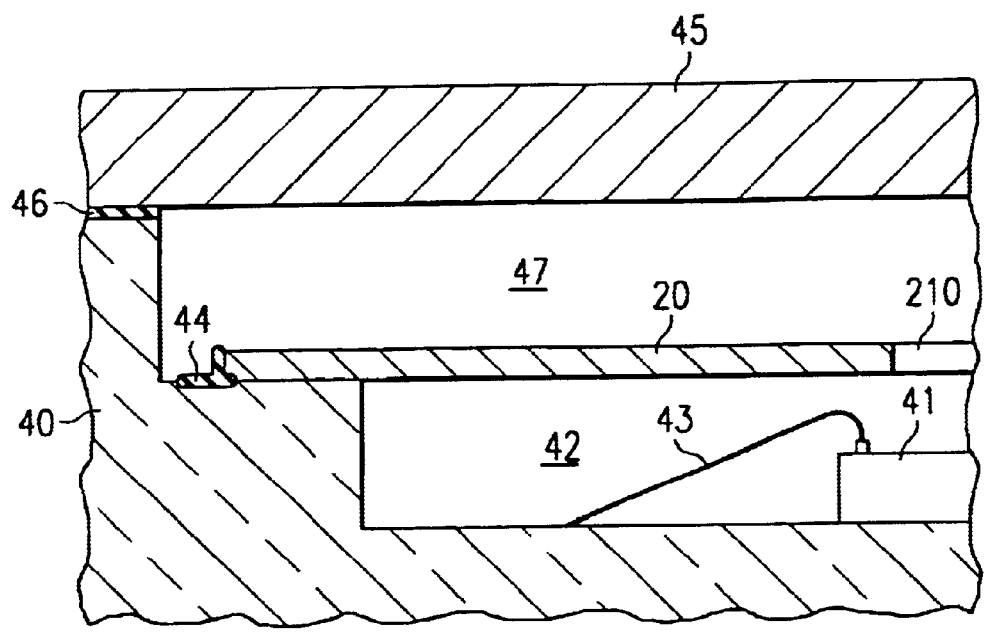
FIG. 4 is a cross-sectional drawing showing an example of a DMD package, which contains the drop-in aperture of this invention.

FIG. 4 is a cross-section of a SLM package out-fitted with the drop-in aperture of this invention. The package is comprised of a substrate 40 with a chip cavity 42, an SLM or other electro-optical chip 41, such as a light emitting diode (LED) or LED array, bonding wires 43, the drop-in aperture 20 of this invention with aperture opening 210, and a top cover 45. An adhesive, or other attachment means 44 is used to mount the drop-in aperture 20 in place inside the package cavity 42. Additionally, an adhesive 46 is used to attach the top cover glass 45 to the molded package (substrate and case) 40. The drawing illustrates how the cover glass 45 is moved out of the micromirror's focal-plane as indicated by the large space 47 between the aperture 20 and cover glass 45.

Figure 5:
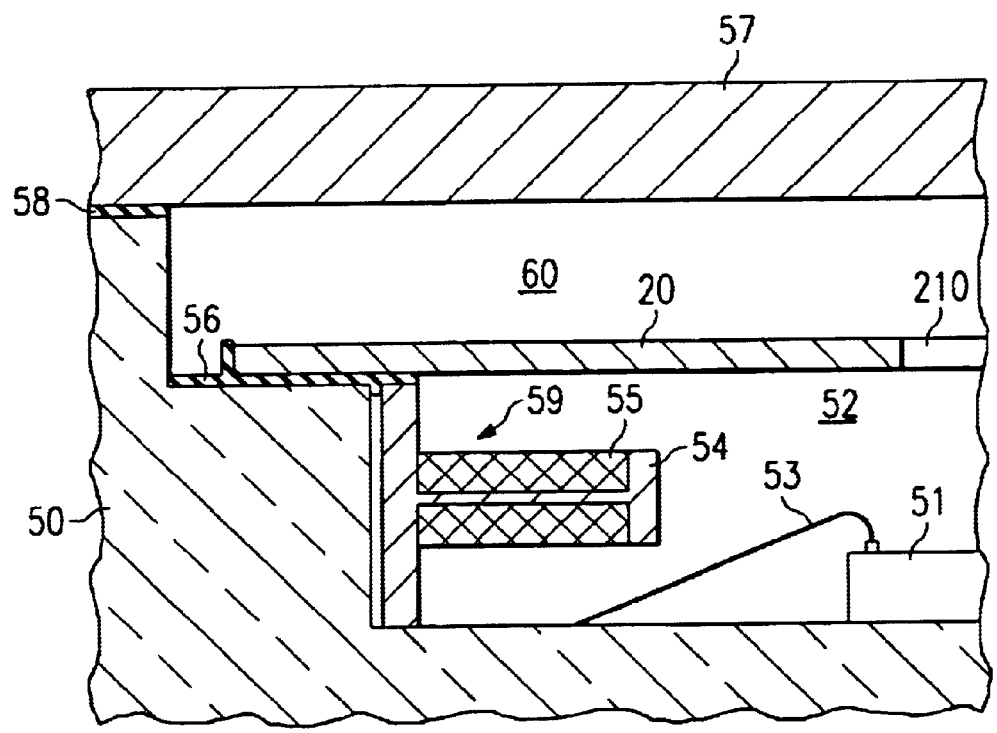
FIG. 5 is a cross-sectional drawing showing an example of a DMD package, which contains both the drop-in aperture of this invention and the drop-in environmental control material carrier of cross-referenced patent application Ser. No. 09/992,178.

FIG. 5 is a cross-sectional drawing illustrating how the drop-in aperture of this invention and a drop-in environmental control material carrier of cross-referenced patent application TI-29638 are combined in the same package. In this example, the semiconductor chip 51 is a micro-electro-mechanical (MEMS) micromirror and the package's top lid 57 is a glass cover. In this case, the carrier frame can be fitted with a combination of up to eight materials 55. The package is comprised of a substrate 50, a micromirror chip 51 mounted in the cavity 52 of the package, bond wires 53, the drop in carrier frame 54 and environmental control materials 55 of the cross-reference application, the drop-in aperture 20 of this invention with aperture opening 210, and a top cover glass 57.

Both the drop-in aperture 20 and drop-in carrier frame 54 are attached to the package substrate 50 with an adhesive 56. The cover glass 57 is also attached to the package with an adhesive 58. This view clearly shows the gap 60 between the drop in aperture 20 and the cover glass 57, which is determined by the height of the package wall. Using a large package wall moves the glass cover out of the micromirror's focal plane. Also shown is the open path 59, above and/or below the environmental control material 55, which allows communication between the environmental control material and the package interior.

Figure 6:
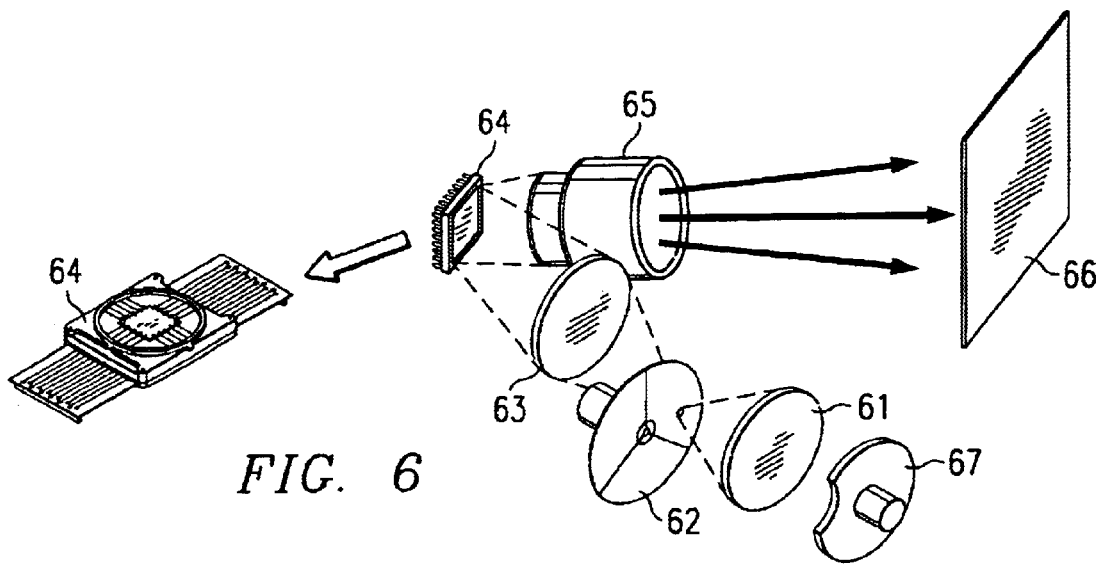
FIG. 6 is a block diagram of a single-DMD projection system using the improved DMD package with the drop-in aperture of this invention.

FIG. 6 is a system level block diagram for a single-micromirror projection display system, which uses the improved micromirror package of this invention. The system is comprised of a light source 60, a first condenser lens 61, a motor/color filter-wheel assembly 62, a second condenser lens 63, a micromirror device 64 in a package with the drop-in aperture of this invention and optionally a drop-in environmental control material carrier, a projection lens 65, and a viewing screen 66.

Figure 7:
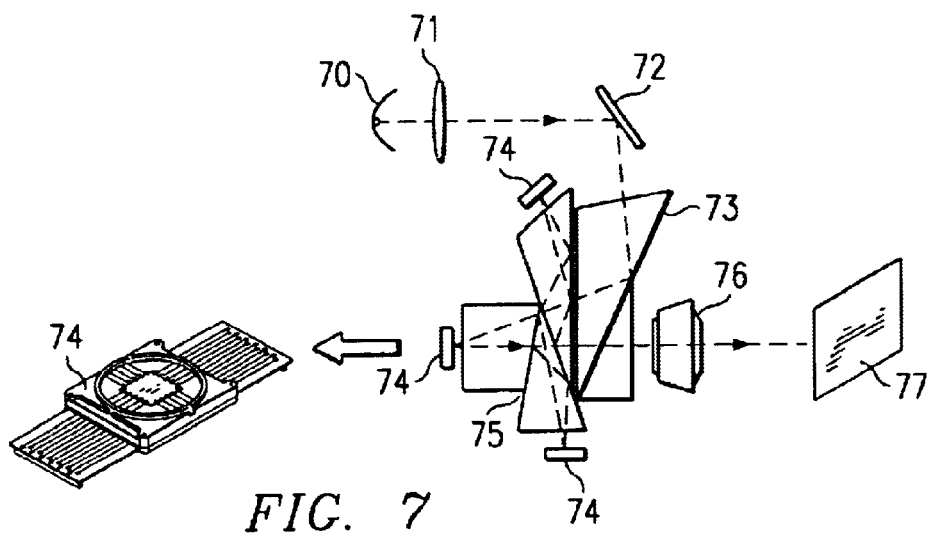
FIG. 7 is a block diagram of a high-brightness, 3-DMD projection display system using the improved DMD package with the drop-in aperture of this invention.

Another example including a high-brightness micromirror projection display, which uses three micromirror devices in the improved packages of this invention, is shown in FIG. 7. This system is comprised of a lamp (light source) and reflector assembly 70, a condenser lens 71, a turning mirror 72, a total internal reflective (TIR) prism 73, three micromirror devices 74 (one each of red, green, and blue light) in packages with the drop-in apertures of this invention and optionally drop-in environmental control material carrier, color splitting/color combining prisms 75, a projection lens 76, and a viewing screen 77.

The improvements to the SLM packages of this invention go a long ways toward improving the performance and lifetime and lowering the cost of projection display systems. Other projection systems also could utilize this improved SLM package.

The disclosed drop-in aperture invention provides advantages, potentially including:
1. use of lower cost piece-parts,
2. better screen border definition,
3. easier assembly, and
4. lower cost micromirror packages.

While this invention has been described in the context of preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A spatial light modulator package, comprising:
   a substrate;
   a case molded to said substrate and defining a package cavity;
   a spatial light modulator in said cavity;
   a cover cooperating with said substrate to enclose said spatial light modulator and allowing light to pass through said cover to said spatial light modulator; and
   an aperture spaced apart from said cover between said cover and said spatial light modulator.

2. The spatial light modulator package of claim 1, wherein said aperture is stamped metal.

3. The spatial light modulator package of claim 1, wherein:
   said aperture is separate from said cover glass; and
   said aperture is mounted on a surface inside said package cavity and in close proximity to said spatial light modulator.

4. The spatial light modulator package of claim 1, wherein said aperture prevents said light from reaching surfaces around perimeter of said spatial light modulator.

5. The spatial light modulator package of claim 1, further comprising:
   a light shield fabricated on the surface of said spatial light modulator chip.

6. The spatial light modulator package of claim 1, wherein said cover is mounted out of the focal plane of the spatial light modulator.

7. The spatial light modulator package of claim 1, said cover having an anti-reflective coating.

8. The spatial light modulator package of claim 1, said spatial light modulator being a micromirror.

9. The spatial light modulator package of claim 1, further comprising:
   an environmental control material carrier in said cavity; and
   getters held by said carrier.

10. The spatial light modulator package of claim 9, wherein said getters are comprised of moisture collecting desiccants.

11. The spatial light modulator package of claim 10 wherein said aperture and carrier are combined.

12. A projection display comprising:
    a light source for producing a beam of light;
    a first condenser lens for focusing said beam of light;
    a color filter wheel for filtering said focused beam of light;
    a second condenser lens for focusing said filtered beam of light;
    a spatial light modulator array mounted in a package with a drop-in aperture and window for spatially modulating said beam of light; and
    a projection lens for focusing said spatially modulated beam of light on an image plane.

13. The projection display of claim 12 wherein:
    said spatial light modulator array is a micromirror array; and
    said aperture is mounted in close proximity to said micromirror array to limit the light reaching the area surrounding said micromirror array; and
    said cover glass is mounted out of the focal plane of said micromirror array.

14. The projection display of claim 12 further comprising at least one environmental control material carrier.

15. The projection display of claim 14 wherein said environmental control material carrier holds at least one environmental control material selected from the group consisting of: moisture collecting desiccants and lubricant storage reservoirs.

16. A spatial light modulator package, comprising:
    a substrate defining a package cavity;
    a spatial light modulator in said cavity;
    a cover cooperating with said substrate to enclose said spatial light modulator and allowing light to pass through said cover to said spatial light modulator; and
    an aperture spaced apart from said cover and between said cover and said spatial light modulator.

17. The spatial light modulator package of claim 16, wherein said aperture is stamped metal.

18. The spatial light modulator package of claim 16, wherein:
    said aperture is mounted closer to the plane of said spatial light modulator than to the plane of said cover.

19. The spatial light modulator package of claim 16, said cover having an anti-reflective coating.

20. The spatial light modulator package of claim 16, said spatial light modulator being a micromirror.

21. The spatial light modulator package of claim 16, further comprising:
    an environmental control material carrier in said cavity; and
    getters held by said carrier.

22. The spatial light modulator package of claim 21 wherein said aperture and carrier are combined.

23. A projection display comprising:
    a light source for producing a beam of light on a light path;
    a spatial light modulator on said light path for spatially modulating said beam of light, said spatial light modulator comprising:
    a substrate defining a package cavity;
    a modulation device in said cavity;
    a cover cooperating with said substrate to enclose said modulation device and allowing light to pass through said cover to said modulation device; and
    an aperture spaced apart from said cover and between said cover and
    said modulation device; and
    a projection lens on said light path for focusing said spatially modulated beam of light onto an image plane.

24. The projection display of claim 23 wherein:
    said spatial light modulator array is a micromirror array; and
    said aperture is mounted in close proximity to said micromirror array to limit the light reaching the area surrounding said micromirror array; and said cover glass is mounted out of the focal plane of said micromirror array.

25. The micromirror projection display of claim 23 further comprising at least one environmental control material carrier.

26. A method of packaging a spatial light modulator, the method comprising:

providing a package substrate;

attaching a spatial light modulator to said substrate;

attaching an aperture to said substrate in proximity to said spatial light modulator to limit light from reaching regions selected from the group consisting of regions of said substrate, regions of said spatial light modulator, bond wires, bond pads, and other peripheral structures; and attaching a cover to said substrate to enclose said aperture and said spatial light modulator.

27. The method of claim 26, said attaching a spatial light modulator comprising attaching a micromirror device to said substrate.

28. The method of claim 26, said attaching an aperture to said substrate comprising attaching said aperture to a case attached to said substrate.

29. The method of claim 26, said attaching a cover to said substrate comprising attaching said cover to a case attached to said substrate.

* * * * *